United States Patent
Munden et al.

(10) Patent No.: US 6,762,952 B2
(45) Date of Patent: Jul. 13, 2004

(54) MINIMIZING ERRORS IN A MAGNETORESISTIVE SOLID-STATE STORAGE DEVICE

(75) Inventors: Terrel R. Munden, Boise, ID (US); Sarah M. Brandenberger, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 135 days.

(21) Appl. No.: 10/138,074

(22) Filed: May 1, 2002

(65) Prior Publication Data

US 2003/0206432 A1 Nov. 6, 2003

(51) Int. Cl.[7] .................. G11C 11/00; G11C 11/14; G11C 7/00; G11C 29/00; G11C 7/02; G11C 8/00; G11C 8/02

(52) U.S. Cl. .................. 365/158; 365/171; 365/200; 365/201; 365/209; 365/230.07; 365/232; 365/243.5

(58) Field of Search .................. 365/158, 171, 365/200, 201, 209, 230.07, 232, 234.5

(56) References Cited

U.S. PATENT DOCUMENTS

| | | | | |
|---|---|---|---|---|
| 6,011,734 A | * | 1/2000 | Pappert | 365/200 |
| 6,041,000 A | * | 3/2000 | McClure et al. | 365/200 |
| 6,108,251 A | * | 8/2000 | Manning | 365/200 |
| 6,212,648 B1 | * | 4/2001 | Abe | 714/8 |
| 2002/0019961 A1 | * | 2/2002 | Blodgett | 714/718 |
| 2002/0050840 A1 | * | 5/2002 | Honigschmid | 326/100 |
| 2003/0002330 A1 | * | 1/2003 | Nishimura | 365/158 |
| 2003/0026142 A1 | * | 2/2003 | Yamada | 365/200 |
| 2003/0128603 A1 | * | 7/2003 | Savtchenko et al. | 365/200 |
| 2003/0132494 A1 | * | 7/2003 | Tuttle et al. | 257/433 |
| 2003/0133323 A1 | * | 7/2003 | Nejad | 365/158 |

* cited by examiner

*Primary Examiner*—David Nelms
*Assistant Examiner*—Ly Duy Pham (57) ABSTRACT

Exemplar embodiments are disclosed which allow errors in a magnetoresistive solid-state storage device, such as a magnetic random access memory (MRAM) device, to be minimized. An illustrative method includes the steps of identifying cells in the device which have a failure mode characterized by a propensity to remain in a particular orientation of magnetization, mapping the location of the identified cells, and compensating for the failure mode of a cell at a mapped location. Systems and computer readable media are also provided.

24 Claims, 5 Drawing Sheets

MINIMIZING ERRORS IN A MAGNETORESISTIVE SOLID-STATE STORAGE DEVICE

BACKGROUND OF THE INVENTION

1. Field of the Invention

The invention relates generally to magnetoresistive solid-state storage devices, and, more particularly, to minimizing errors in a magnetoresistive solid-state storage device.

2. Related Art

A typical magnetoresistive solid-state storage device, such as a magnetic random access memory (MRAM) device, includes an array of storage cells. Each of the cells is typically constructed of two layers of magnetic film, separated by a dielectric layer. The orientation of the magnetization of one of the layers is alterable, while the orientation of the magnetization of the other layer is fixed or "pinned" in a particular orientation. The magnetic film layer having alterable magnetization is typically referred to as a "data storage layer" and the magnetic film layer which is pinned is typically referred to as a "reference layer."

Conductive traces are typically routed across the array of storage cells. These conductive traces are typically arranged in rows and columns. The conductive traces extending along the rows of the storage cells are generally referred to as "word lines" and the conductive traces extending along the columns of the storage cells are generally referred to as "bit lines." The word lines and bit lines are typically oriented perpendicular to each other. Located at each intersection of a word line and a bit line, each storage cell stores a bit of information as an orientation of magnetization.

Typically, the orientation of magnetization in the data storage layer aligns along an axis of the data storage layer that is commonly referred to as its easy axis. Typically, external magnetic fields are applied to flip the orientation of magnetization in the data storage layer along its easy axis to either a parallel or anti-parallel orientation with respect to the orientation of magnetization in the reference layer, depending on the desired logic state.

The orientation of magnetization of each storage cell will assume one of two stable orientations at any given time. Typically, these two stable orientations, parallel and anti-parallel, represent the logic values of "1" and "0," respectively. Alternatively, a system can be configured to interpret the anti-parallel state as a logic "1" and the parallel state as a logic "0." The orientation of magnetization of a selected storage cell may be changed (i.e., from parallel to anti-parallel, or vice versa) by supplying current to a word line and a bit line crossing at the location of the selected storage cell. The currents create magnetic fields that, when combined, can switch the orientation of magnetization of the selected storage cell from parallel to anti-parallel or vice versa.

Ideally, the magnetic fields in each cell of an MRAM array will align in either the parallel or anti-parallel directions. Unfortunately, however, due to imperfections in the magnetic materials used to form MRAM arrays, each cell in the MRAM array may not be a perfect rectangle. Therefore, the magnetic fields in some of the storage cells may be misaligned with respect to each other. The magnetic fields in such a cell will typically demonstrate a preference for aligning in either the anti-parallel orientation or the parallel orientation, which may result in an error when an attempt is made to write data to the cell. In some circumstances, the magnetic fields in a particular cell may even become stuck in either the anti-parallel orientation or the parallel orientation. A cell having a propensity to favor one orientation over the other typically does not switch its orientation reliably when written to, thus introducing an error into the data. For example, assume that it is desired to store the binary number 0000 in an MRAM array. However, when each bit of the binary number 0000 is written to a cell in the array, one of the bits is written to a cell that has a propensity to remain in the orientation of magnetization that corresponds to a logic "1." Therefore, when the number is read from the array, a "1" rather than a "0" will be read from the cell having a propensity to remain in the orientation that corresponds to a "1" (e.g., the number read from the array could be 0010 instead of 0000), thus introducing an error into the system.

Therefore, there is a need for overcoming the deficiencies and inadequacies stated above.

SUMMARY

The present disclosure provides exemplar embodiments which allow errors in a magnetoresistive solid-state storage device having a plurality of cells, such as a magnetic go random access memory (MRAM) device array, to be minimized. An illustrative method may be characterized as comprising the steps of identifying cells in a magnetoresistive solid-state storage device which have a failure mode characterized by a propensity to remain in a particular orientation of magnetization, mapping the location of the identified cells, and compensating for the failure mode of a cell at a mapped location.

An illustrative system comprises a testing element configured to identify cells in a magnetoresistive solid-state storage device which have a failure mode characterized by a propensity to remain in a particular orientation of magnetization, a memory element, and a processing element configured to map the location of the identified cells into the memory element and to compensate for the failure mode of a mapped cell.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

In the following detailed description of the invention, reference is made to the accompanying drawings which form a part hereof, and in which are shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. For example, although described below as applied to a magnetic random access memory (MRAM) array, the invention is generally applicable to any device that uses a magnetoresistive storage cell as a storage element, including but not limited to MRAMs, EEPROMS, flip-flops, shift-registers, etc.

Figure 1:
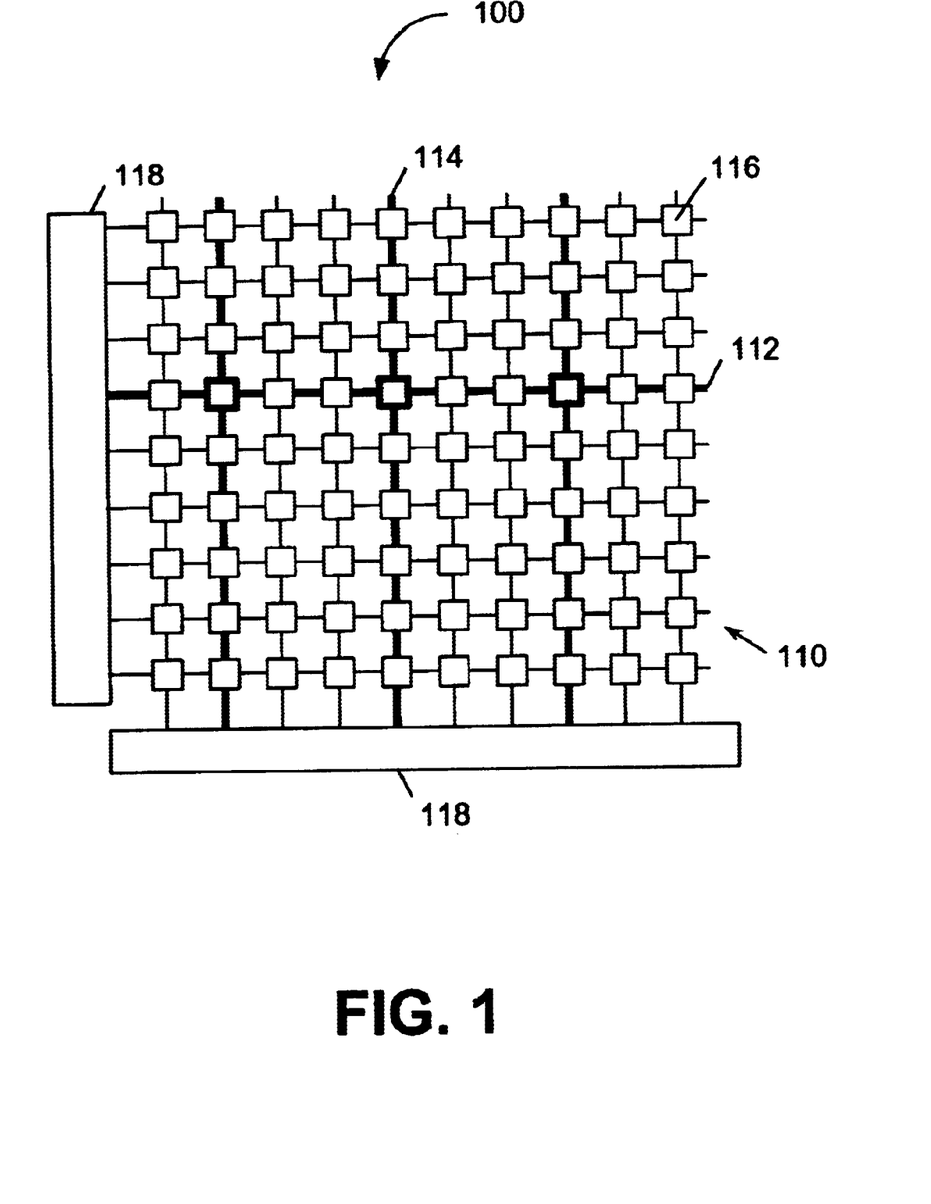
FIG. 1 is an illustration of a simplified magnetic random access memory (MRAM) device array, which is an exemplary magnetoresistive solid-state storage device, upon which embodiments of the present invention may operate.

Referring now to the figures, wherein like reference numerals indicate corresponding components throughout the several views, FIG. 1 is an illustration of a simplified magnetic random access memory (MRAM) device, which is an exemplary magnetoresistive solid-state storage device, upon which embodiments of the present invention may operate. FIG. 1 illustrates a simplified MRAM device 100 comprising an array 110 of storage cells 116 coupled to control circuits 118.

In a typical embodiment, the MRAM device 100 comprises approximately 1024 by 1024 storage cells, just a few of which are illustrated. The storage cells 116 are each formed at an intersection between control lines 112 and 114. In this example control lines 112 are arranged in rows, and control lines 114 are arranged in columns. The control lines 112 and 114 are generally orthogonal, but other more complicated lattice structures are also possible. Suitably, the row and column lines 112 and 114 are coupled to control circuits 118, which include a plurality of read/write control circuits. Depending upon the implementation, one read/write control circuit is provided per column, or read/write control circuits are multiplexed or shared between columns.

In a device access such as a write operation or a read operation, one row 112 and one or more columns 114 are typically selected by the control circuits 118 to access the required storage cell or cells 116, as illustrated in FIG. 1. Depending on the orientation of the array 110, however, one column 114 and several rows 112 may be selected by the control circuits 118. With reference to the exemplar configuration illustrated in FIG. 1, the selected cells 116, the selected row line 112, and the selected column lines 114, are each represented by bold lines. A typical MRAM device requires a minimum distance m, such as sixty-four cells, between the selected column lines 114 to minimize cross-cell interference. Given that each array 110 has rows of length l, such as 1024 storage cells, it is possible to access simultaneously up to $l/m = 1024/64 = 16$ uniquely addressable cells from the array 110.

Each storage cell 116 stores one bit of data suitably representing a numerical value and preferably a binary value (i.e., one or zero). Suitably, each storage cell includes two films which assume one of two stable magnetization orientations, known as parallel and anti-parallel. The magnetization orientation affects the resistance of the storage cell. When the storage cell 116 is in the anti-parallel state, the resistance is at its highest, and when the magnetic storage cell is in the parallel state, the resistance is at its lowest. Suitably, the high resistance anti-parallel state defines a "0" logic state, and the low resistance parallel state defines a "1" logic state, or vice versa. In a typical embodiment of a magnetoresistive solid-state storage device, the resistance of each storage cell 116 is determined according to a phenomenon known as spin tunneling and the cells are referred to as magnetic tunnel junction storage cells. The condition of the storage cell is determined by measuring the sense current (proportional to resistance) or a related parameter such as response time to discharge a known capacitance, which gives one or more parametric values for each storage cell. A logical value can then be derived from the obtained parametric value or values. Depending upon the nature and construction of the MRAM device, the read operation may comprise multiple steps or require combined read and rewrite actions.

Figure 2:
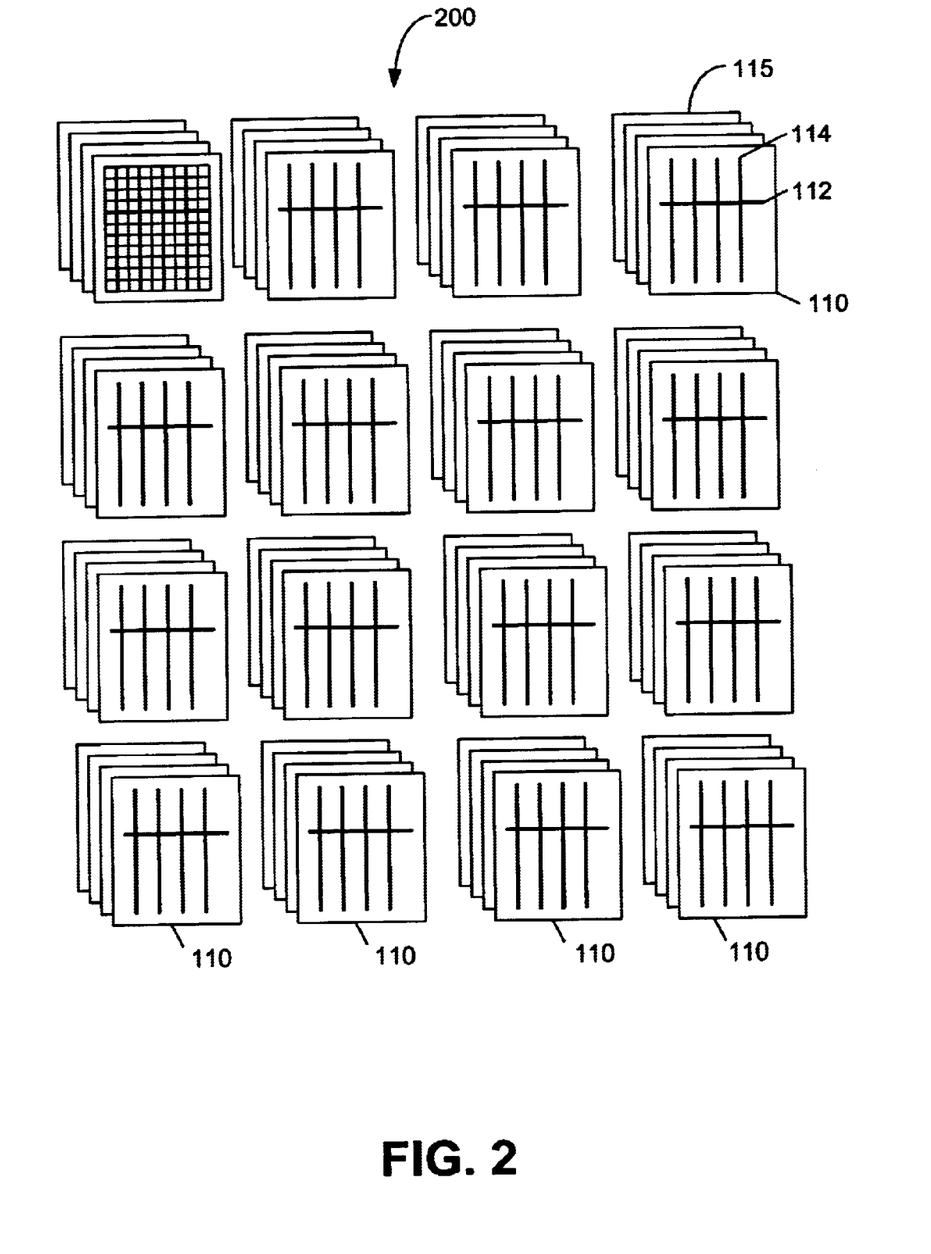
FIG. 2 is a detailed illustration of an embodiment of the MRAM device array of FIG. 1.

FIG. 2 shows the MRAM device 100 of FIG. 1 in greater detail. A macro-array 200 is formed comprising a large plurality of individual arrays 110, each of which is formed as discussed above for FIG. 1 (control circuits 118 have been omitted from FIG. 2 for simplicity). The use of plural arrays advantageously allows an MRAM device to be obtained of a desired overall data storage capacity, without the individual arrays 110 in themselves becoming so large that they are difficult to manufacture or control. For simplicity, FIG. 2 shows only a portion of the macro-array 200.

Many design choices are available to one having ordinary skill in the art when laying out the arrays 110 on a suitable substrate during manufacture of the device, but, among other concerns, it is commonly desired to reduce substrate area for each array. Conveniently, it has been found that the arrays 110 can be manufactured in layers. In the example of FIG. 2, four arrays 110 are layered to form a stack 115. In an example practical device having a storage capacity on the order of 144 Mb, 1152 arrays 110 are arranged in a macro-array of 16 arrays wide, by 18 arrays high, with four stack layers. Optionally, the MRAM device comprises more than one such macro-array.

As illustrated in FIG. 2, the macro-array 200 may be accessed by selecting one row 112 in each of a plurality of arrays 110, and selecting plural columns 114 from each of the plurality of arrays to thereby select a plurality of storage cells 116 (FIG. 1). The accessed cells within each of the plurality of arrays correspond to a small portion of a unit of data. Together, the accessed cells provide a whole unit of data, such as a whole sector unit, or at least a substantial portion of the unit. Advantageously, each of the plurality of arrays are accessible substantially simultaneously, which is known in the art as a slice through the macro-array. By using a slice through, device access speed for a read operation or a write operation is increased.

As shown in FIG. 2, it is convenient for the same row address and the same column addresses to be selected in each of the plurality of arrays 110. That is, a unit of data is stored across a plurality of arrays 110, using the same row and column addresses within each of the plurality of arrays 110.

As also shown in FIG. 2, the arrays 110 are typically layered to form stacks. Only one array within each stack can be accessed at any one time. Therefore, it is convenient that the alp plurality of arrays 110 used to store a sector unit of data are each in different stacks (i.e., none of the selected plurality of arrays are in the same stack). Also, it is convenient to select arrays which are all in the same layer. Ideally, one array is selected from each stack, the arrays each being in the same layer within each stack. In the example illustrated in FIG. 2, the topmost array within each stack has been selected.

Most conveniently, the number of arrays available in the macro-array 200 is matched to the size of a sector unit of data to be stored in the device. Here, it is convenient to provide the total number of arrays such that, given the number of cells which can be simultaneously accessed in an array, a sector unit is stored using cells within all of the arrays of a single layer of the device, to store a whole sector unit of data. In other embodiments, it is convenient for an integer fraction of a sector unit of data (e.g., one half or one third of a sector unit) to be accessible simultaneously.

Although generally reliable, it has been found that failures can occur which affect the ability of the device to store data reliably in the storage cells 116. Failures are highly undesirable and mean that at least some storage cells in the device cannot be written or read reliably. A cell affected by a failure can become unreadable, in which case no logical value can be read from the cell, or can become unreliable, in which case the logical value read from the cell is not necessarily the same as the value written to the cell (e.g., a "1" is written but a "0" is read). The storage capacity and reliability of the device can be severely affected and in the worst case the entire device becomes unusable.

Failure mechanisms can take many forms. An embodiment of the present invention is directed to minimizing the errors which result from a propensity of a cell to remain in either the parallel or anti-parallel state during normal operation, despite attempts to write the cell to a different state. As used herein, the propensity of a cell to remain in a particular state includes situations in which the resistance of a cell is much higher or much lower than the resistance of a typical cell in the array, as well as situations in which a cell is stuck in a particular orientation. If the resistance of a cell is much lower than the resistance of a typical cell in the array (typically referred to as a "shorted bit"), the cell will typically remain in the parallel state at higher bias voltages than would otherwise be necessary to flip the cell to the anti-parallel state. If the resistance of a cell is much higher than the resistance of a typical cell in the array (typically referred to as an "open bit"), the cell will typically remain in the parallel state at higher bias voltages than would otherwise be necessary to flip the cell to the anti-parallel state. If a cell is stuck in either the parallel orientation or the anti-parallel orientation, the cell will not change its orientation in response to a write command even if the bias voltage is increased.

An embodiment of the invention allows data to be written and read correctly to sections of memory that include cells having a propensity for either the parallel state or the anti-parallel state. An exemplar methodology for testing the cells in an MRAM array to determine which, if any, of the cells have a propensity to remain in either the parallel or anti-parallel state during normal operation will now be described with reference to FIG. 3. It should be noted that a device may be tested through testing each cell in the device or, alternatively, through testing rows and/or columns of cells. Because some of the above-described failure modes may result in the failure of related groups of cells (e.g., shorted bits typically affect all storage cells lying in the same row and the same column; open bits can, but do not always, affect all storage cells lying in the same row or column, or both), the propensity of each cell in the array for a particular state may be predicted without actually testing each cell individually, so long as a statistically significant sample of the cells is tested.

Figure 3:
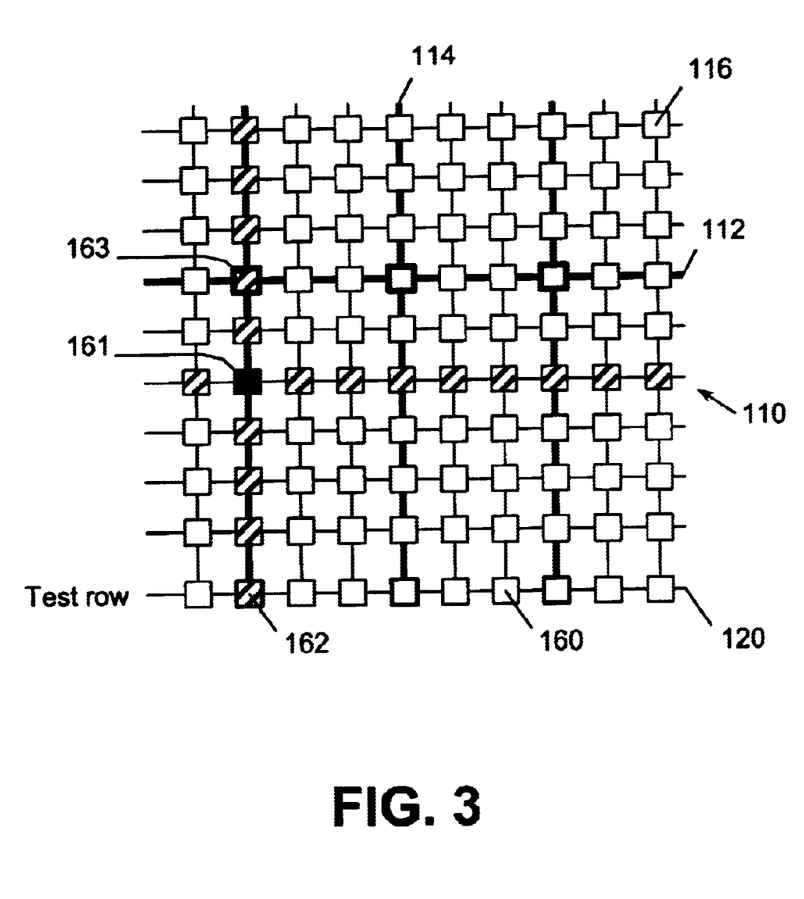
FIG. 3 is another illustration of the MRAM device array of FIG. 1.

FIG. 3 shows schematically a portion of an array 110, similar to the array described above with reference to FIG. 1. In FIG. 3, the array 110 includes a row 120 of test cells 160. Conveniently, the test cells 160 are configured identically to the storage cells 116 of the remainder of the array. The test row 120 can be provided at any convenient location, such as at the top or at the bottom or within the array 110. Typically, a row of storage cells 116 from the array 110 is selected to function as the test row 120. The test row is suitably selected to be a row which itself does not contain failed cells, but which is positioned to be affected by failed cells in other rows. The test row is preferably determined at manufacture of the device. If desired, the test row 120 can be reselected or moved from time to time.

Conveniently, it has been found that examining the condition of the test cells 160 in the test row 120 allows accurate predictions to be made about the condition of storage cells 116 in other parts of the array. As an illustrative example, FIG. 3 shows a portion of the array 110 where a cell 161 suffers a shorted-bit failure. Due to the nature of this failure in the exemplar MRAM device of FIG. 3, the shorted-bit cell 161 affects all of the cells lying in the same row and in the same column, including a test cell 162 among the test cells 160 in the test row 120. Therefore, the test cell 162 indicates that a shorted-bit failure has occurred affecting the column in which that test cell 162 lies.

During a read operation, a row line 112 and one or more column lines 114 are activated (e.g., by the control circuits 118 of FIG. 1) to select a set of storage cells 116 within the array 110, as illustrated by bold lines in FIG. 3. A cell 163 which has been affected by the shorted-bit cell 161 is among these selected cells. By examining the condition of the test cell 162, it can be predicted that the cell 163 has been affected by a failure. This prediction then allows enhancements to be made in the subsequent stages of the read operation concerning the selected cells.

Other schemes may be employed to determine which, if any, of the cells in the array have a propensity to remain in either the parallel or anti-parallel state during normal operation. In one simple mode of operation, the test cells are examined once, in order to determine columns 114 within the array 110 which are affected by failures, particularly shorted-bit failures, open-bit failures, or "stuck" bits.

Examination of the test cells 160 may take any suitable form. In one embodiment, each test cell 160 is written with a known value, such as a logical "1." The test cells 160 are then examined by reading logical values from the test cells 160. If any of the test cells show a logical value of "0" then it can be predicted that a failure, such as a shorted-bit failure, has occurred which affects the column 114 in which that test cell 160 lies. Similarly, writing a "0" to the test cells and reading a "1" would indicate an open-bit failure. Optionally, two test rows may be provided, with the first arranged to indicate a shorted-bit failure, and the second arranged to indicate an open-bit failure. The test cells can be written once and read repeatedly, or can be rewritten after each read, as required to maintain integrity of the cells. The location and nature of the test cells 160 and the method for examination of the test cells 160 is readily adapted according to the specific nature of a particular MRAM device.

Although test cells 160 may be used to predict the failure modes of cells in an array, alternatively, each cell in the array may be tested, such as during burn in, to determine the failure mode of each cell. For example, assume that the parallel state constitutes a logic "1" and that the anti-parallel state constitutes a logic "0." In one embodiment, each cell in the array 110 is written with a known value, such as a logic "1." If the cell reads back a logic "0" then the cell is deemed to have a propensity for the anti-parallel state. Similarly, writing a "0" to a cell and reading back a "1" would indicate that the cell has a propensity for the parallel state.

Once the cells having a propensity for a particular orientation are identified, by testing each cell or by testing a statistically significant number of selected test cells and predicting the propensity of the other cells based on the results of the selected test cells, data is stored in the cells in ways that compensate for the propensities. Thus, the invention allow these cells to be used rather than avoided.

Figure 4:
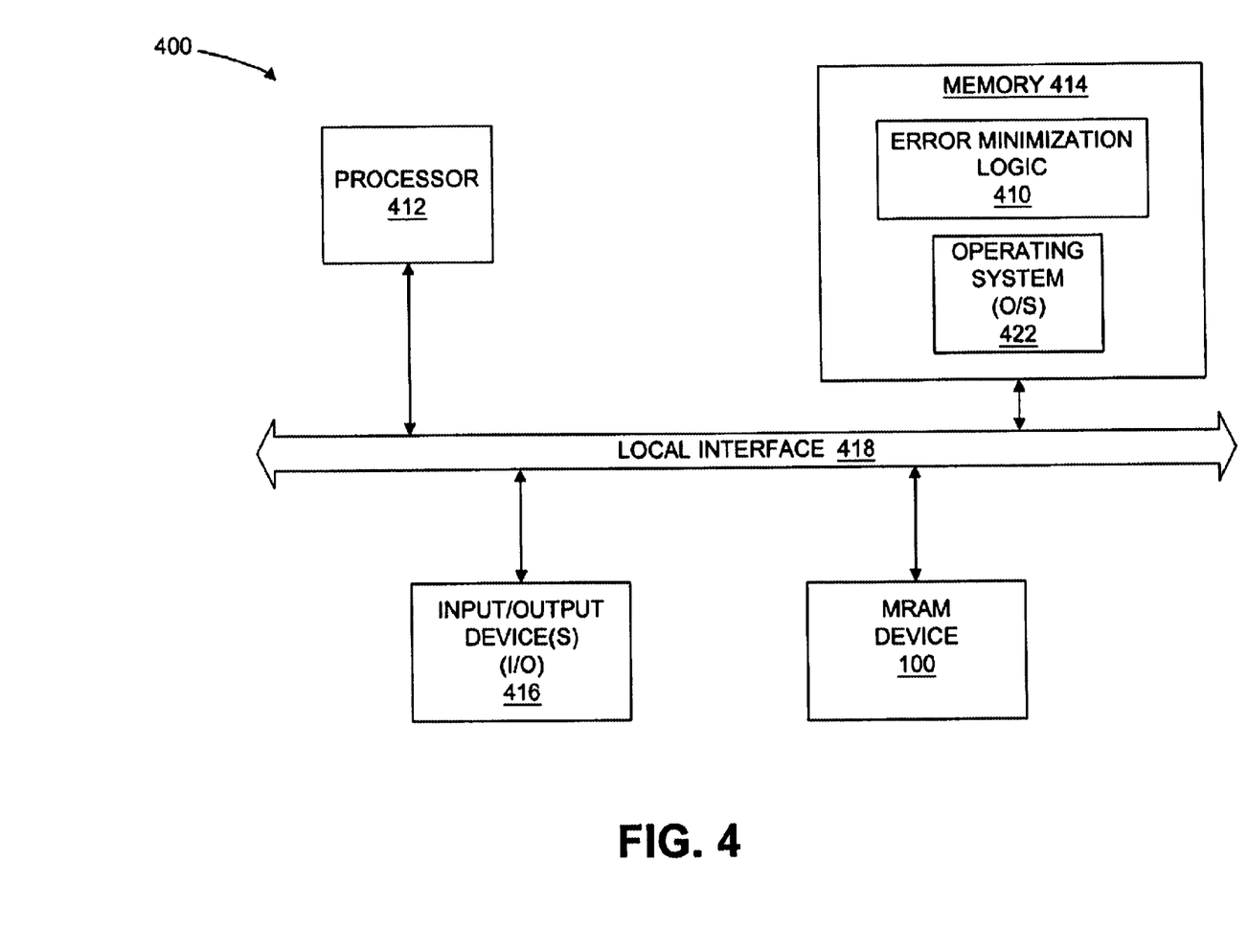
FIG. 4 is a simplified block diagram of a computer system which may be used to implement an embodiment of the invention.

Embodiments of the invention can be implemented in software (e.g., firmware), hardware, or a combination thereof. As a non-limiting example, the system may be implemented in a computer system, which includes software, as an executable program, that is executed by a special or general purpose processor, such as a processor in a personal computer (PC; IBM-compatible, Apple-compatible, or otherwise), workstation, minicomputer, or mainframe computer. An example of a general purpose computer that can implement embodiments of the present invention is shown in FIG. 4. In FIG. 4, the computer system is denoted by reference numeral 400.

Generally, in terms of hardware architecture, as shown in FIG. 4, the computer system 400 includes an MRAM device 100 configured as illustrated above with respect to FIG. 1, which is an exemplar magnetoresistive solid-state storage device for which it is desired to implement embodiments of the present invention. The computer system 400 also includes a processor 412, memory 414, and one or more input and/or output (I/O) devices 416 (or peripherals), all of which are communicatively coupled via a local interface 418. The local interface 418 can be, for example but not limited to, one or more buses or other wired or wireless connections, as is known in the art. The local interface 418 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 412 is a hardware device for executing software, particularly that stored in memory 414. The processor 412 can be any custom made or commercially available processor, a central processing unit (CPU), an auxiliary processor among several processors associated with the computer system 400, a semiconductor based microprocessor (in the form of a microchip or chip set), a macroprocessor, or generally any device for executing software instructions. Examples of suitable commercially available microprocessors are as follows: a PA-RISC series microprocessor from Hewlett-Packard Company, an 80×86 or Pentium series microprocessor from Intel Corporation, a PowerPC microprocessor from IBM, a Sparc microprocessor from Sun Microsystems, Inc, or a 68xxx series microprocessor from Motorola Corporation.

The memory 414 can include any one or a combination of volatile memory elements (e.g., random access memory (RAM, such as DRAM, SRAM, SDRAM, etc.)) and non-volatile memory elements (e.g., magnetic random access memory (MRAM), ROM, hard drive, tape, CDROM, etc.). It should be noted that an MRAM is non-volatile while other types of RAM (i.e., DRAM, SRAM, SDRAM, etc.) are volatile. Thus, it may be advantageous to use a nonvolatile MRAM rather than a volatile RAM in certain applications. This further emphasizes the need for minimizing errors in an MRAM array. Although shown as residing outside of memory 414, MRAM device 100 alternatively may comprise part of memory 414.

The memory 414 also may incorporate electronic, magnetic, optical, and/or other types of storage media. Note that the memory 414 can have a distributed architecture, where various components are situated remote from one another, but can be accessed by the processor 412.

The software in memory 414 may include one or more separate programs, each of which comprises an ordered listing of executable instructions for implementing logical functions. In the example of FIG. 4, the software in the memory 414 includes error minimization logic 410 and a suitable operating system (O/S) 422. A nonexhaustive list of examples of suitable commercially available operating systems 422 is as follows: (a) a Windows operating system available from Microsoft Corporation; (b) a Netware operating system available from Novell, Inc.; (c) a Macintosh operating system available from Apple Computer, Inc.; (d) a UNIX operating system, which is available for purchase from many vendors, such as the Hewlett-Packard Company, Sun Microsystems, Inc., and AT&T Corporation; (e) a LINX operating system, which is freeware that is readily available on the Internet; (f) a run time Vxworks operating system from WindRiver Systems, Inc.; or (g) an appliance-based operating system, such as that implemented in handheld computers or personal data assistants (PDAs) (e.g., PalmOS available from Palm Computing, Inc., and Windows CE available from Microsoft Corporation). The operating system 422 essentially controls the execution of other computer programs, such as the error minimization logic 410, and provides scheduling, input-output control, file and data management, memory management, and communication control and related services.

The error minimization logic 410 can be a source program, executable program (object code), script, or any other entity comprising a set of instructions to be performed. When a source program, then the program is typically translated via a compiler, assembler, interpreter, or the like, which may or may not be included within the memory 414, so as to operate properly in connection with the O/S 422. Furthermore, the error minimization logic 410 can be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

The I/O devices 416 may include input devices, for example but not limited to, a keyboard, mouse, scanner, microphone, etc. Furthermore, the I/O devices 416 may also include output devices, for example but not limited to, a printer, display, etc. Finally, the I/O devices 416 may further include devices that communicate both inputs and outputs, for instance but not limited to, a modulator/demodulator (modem; for accessing another device, system, or network), a radio frequency (RF) or other transceiver, a telephonic interface, a bridge, a router, etc.

If the computer 400 is a PC, workstation, or the like, the software in the memory 414 may further include a basic input output system (BIOS) (omitted for simplicity). The BIOS is a set of essential software routines that initialize and test hardware at startup, start the O/S 422, and support the transfer of data among the hardware devices. The BIOS is stored in ROM so that the BIOS can be executed when the computer 300 is activated.

When the computer 400 is in operation, the processor 412 is configured to execute software stored within the memory 414, to communicate data to and from the memory 414, and to generally control operations of the computer 400 pursuant to the software. The error minimization logic 410 and the O/S 422, in whole or in part, but typically the latter, are read by the processor 412, perhaps buffered within the processor 412, and then executed.

When the error minimization logic 410 is implemented in software, as is shown in FIG. 4, it should be noted that the error minimization logic 410 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The error minimization logic 410 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system is implemented in hardware, the error minimization logic 410 can each be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 5:
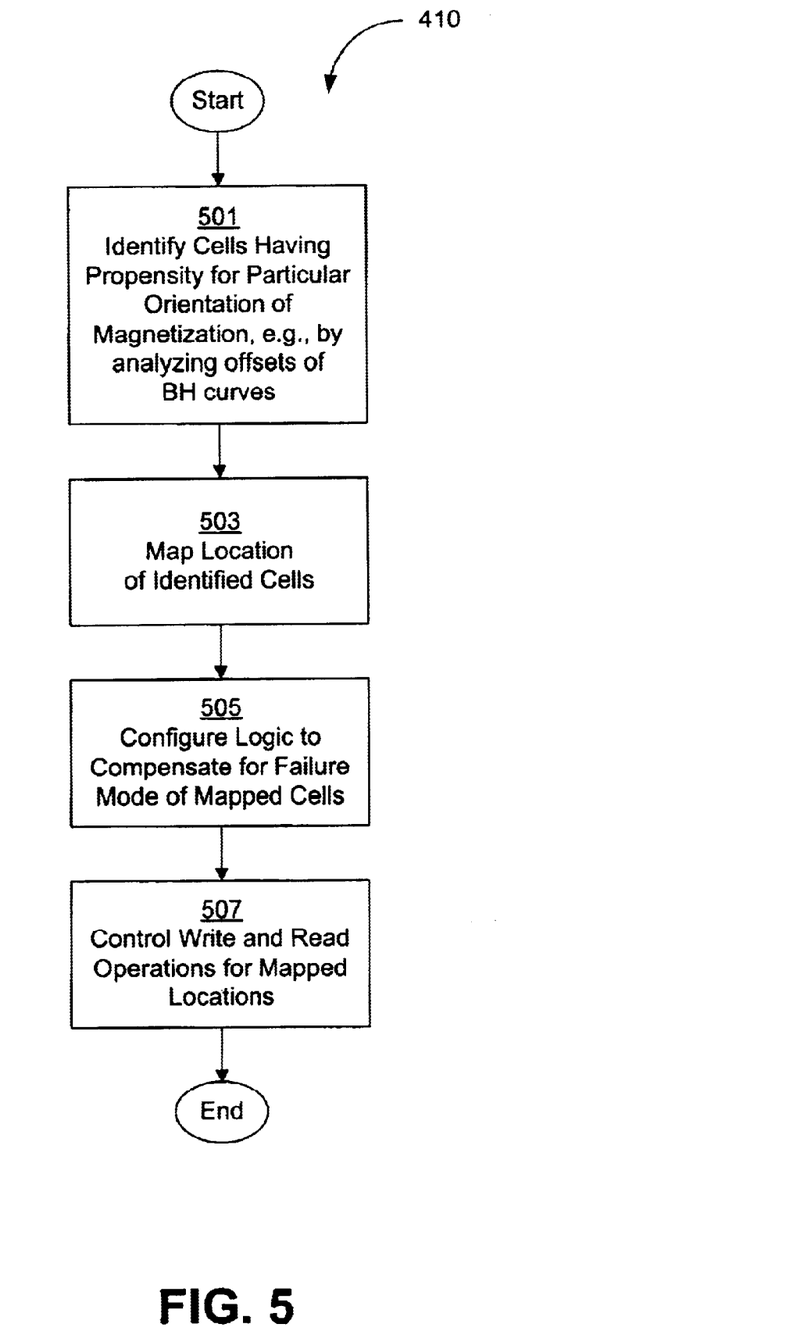
FIG. 5 is an exemplary flowchart illustrating the steps performed by the error minimization logic of FIG. 4 to minimize errors in a magnetoresistive solid-state storage device array, such as an MRAM device array.

FIG. 5 is a flowchart that illustrates an exemplar method that can be implemented by the error minimization logic 410 of FIG. 4 to minimize errors when storing data in an Magnetoresistive solid-state storage device, such as MRAM device 100. Any process descriptions or blocks in flow charts should be understood as representing modules, segments, or portions of code which may include one or more executable instructions for implementing specific logical functions or steps in the process. Alternative implementations are included within the scope of embodiments of the invention in which functions may be executed out of order from that shown or discussed, including substantially concurrently or in reverse order, depending on the functionality involved, as would be understood by those reasonably skilled in the art of the invention.

In block 501, the error minimization logic 410 identifies each cell in the MRAM device 100 that has a failure mode characterized by a propensity to favor one orientation of magnetization over the other (i.e., parallel over anti-parallel, or vice versa), and the particular failure mode associated with each cell. In the embodiment illustrated in FIG. 5, the failure mode determination is made by error minimization logic 410.

The invention is not limited by the particular methodology used to identify the cells in the array that have a propensity to favor one orientation of magnetization over the other. Any testing methodology known to persons skilled in the art may be used to determine the propensity of the cells in the device, including but not limited to the exemplar testing methodologies described above with respect to FIG. 3. Another potential testing methodology could involve analyzing the BH curve for some or all of the cells in the device, as is known to persons of ordinary skill in the art. For example, a magnetic field could be applied to each cell in the device (or each cell in a test set), and a determination of the failure mode for each cell could then be made (or predicted if a test set is used) based on an analysis of the offset of the BH curve for each cell in the device (or in the test subset of cells).

Once the failure mode identification has been made in block 501, the error minimization logic proceeds to block 503. In block 503, the locations of the cells identified in block 501 are mapped, such as by storing the locations in memory 414. Blocks 501 and 503 are repeated until the location of each cell in the MRAM device 100 that has a propensity for a particular state of magnetization has been identified and mapped.

In an alternative embodiment (not shown in the drawings) the functions performed in blocks 501 and 503 could be performed as part of the burn in process for MRAM device 100, and the locations of the cells having the determined failure modes could be pre-mapped into the memory 414.

Returning to the embodiment of FIG. 5, once the particular failure modes for each cell location are identified (in block 501) and mapped (in block 503), the error minimization logic 410 is configured in block 505 to compensate for the particular failure mode of each mapped cell. The error minimization logic 410 is then used in block 507 to control write and read operations for each location mapped in block 503, thereby permitting these locations to be used and minimizing the errors associated with such use.

The error minimization logic 410 may encode and decode data in various ways to compensate for the failure mode associated for a particular cell. For example, in one embodiment the error minimization logic 410 may use cells having a propensity for the logic "1" orientation exclusively to store data bits corresponding to a logic "1" and cells having a propensity for the logic "0" orientation exclusively to store data bits corresponding to a logic "0."

In another embodiment, the error minimization logic 410 may encode a bit of data corresponding to a logic "1" by inverting the bit to a logic "0" and may then store the inverted bit in a cell having a propensity for the logic "0" orientation. The error minimization logic 410 would then return the bit to its proper logic state upon decoding.

In still another embodiment, the error minimization logic 410 may utilize an analysis of the offset of the BH curve for each cell in a device (or in a test set of the device) to compensate for cells having a propensity for one logic state over the other. Based on such analysis, the error minimization logic would dynamically alter the strength of the magnetic field applied to write data to a particular cell in order to compensate for that cell's offset of the BH curve (e.g., by increasing the current applied to the particular word and bit lines that intersect at the cell having an offset of the BH curve).

It will be apparent to those skilled in the art that many modifications and variations may be made to the preferred embodiments of the present invention, as set forth above, without departing substantially from the principles of the present invention. Other modifications and variations of the invention may be implemented in order to exploit the basic concept of compensating for the propensity of some cells in an array to favor one logic state over the other. All such modifications and variations are intended to be included herein within the scope of the present invention, as defined in the claims that follow.

What is claimed is:

1. A method for minimizing errors in a magnetoresistive solid-state storage device having a plurality of cells, the method comprising:
    identifying cells in the device which have a failure mode characterized by a propensity to remain in a particular orientation of magnetization;
    mapping the location of the identified cells; and
    compensating for the failure mode of a cell at a mapped location;
    wherein the identifying step comprises:
        defining a subset of the cells in the device;
        testing cells in the subset to identify cells in the subset which have a failure mode characterized by a propensity to remain in a particular orientation of magnetization; and
        predicting whether a cell in the device outside the subset has a failure mode characterized by a propensity to remain in a particular orientation of magnetization based on the identified cells in the subset.

2. A The method of claim 1, further comprising determining whether the propensity of each identified cell is for the parallel orientation or for the anti-parallel orientation.

3. The method of claim 1, wherein the identifying step comprises:
    applying a magnetic field to cells in the device; and
    analyzing the BH curve for each of the cells in the device to which the magnetic field is applied to identify the cells for which the BH curve is offset.

4. A method for minimizing errors in a magnetoresistive solid-state storage device having a plurality of cells, the method comprising:
    identifying cells in the device which have a failure mode characterized by a propensity to remain in a particular orientation of magnetization;
    mapping the location of the identified cells; and
    compensating for the failure mode of a cell at a manned location;
    wherein identifying comprises:
        defining a subset of the cells in the device;
        testing cells in the subset to identify cells in the subset which have a failure mode characterized by a propensity to remain in a particular orientation of magnetization; and
        predicting whether a cell in the device outside the subset has a failure mode characterized by a propensity to remain in a particular orientation of magnetization based on the identified cells in the subset;
    wherein identifying further comprises:
        applying a magnetic field to cells in the subset;
        analyzing the BH curve for each of the cells in the subset to which the magnetic field is applied to identify the cells for which the BH curve is offset; and
        predicting the failure mode of cells in the device outside the subset based on the cells in the subset for which the BH curve is identified as being offset.

5. A method for minimizing errors in a magnetoresistive solid-state storage device having a plurality of cells, the method comprising:
    identifying cells in the device which have a failure mode characterized by a propensity to remain in a particular orientation of magnetization;
    mapping the location of the identified cells;
    compensating for the failure mode of a cell at a mapped location; and determining whether the propensity of each identified cell is for the parallel orientation or for the anti-parallel orientation;
    wherein mapping comprises:
        allocating the cells assessed to have a propensity for the parallel orientation of magnetization to a first group;
        allocating the cells assessed to have a propensity for the anti-parallel orientation of magnetization to a second group;
        storing the location of each cell in the first group; and
        storing the location of each cell in the second group.

6. A method for minimizing errors in a magnetoresistive solid-state storage device having a plurality of cells, the method comprising:
    identifying cells in the device which have a failure mode characterized by a propensity to remain in a particular orientation of magnetization;
    mapping the location of the identified cells; and
    compensating for the failure mode of a cell at a mapped location wherein identifying comprises:
        applying a magnetic field to cells in the device;
        analyzing the BH curve for each of the cells in the device to which the magnetic field is applied to identify the cells for which the BH curve is offset; and
    wherein compensating comprises:
        dynamically altering the strength of the magnetic field applied to write data to a cell to compensate for the cell's offset of the BH curve.

7. A method for minimizing errors in a magnetoresistive solid-state storage device having a plurality of cells, the method comprising:
    identifying cells in the device which have a failure mode characterized by a propensity to remain in a particular orientation of magnetization;
    mapping the location of the identified cells;
    compensating for the failure mode of a cell at a manned location; and
    determining whether the propensity of each identified cell is for the parallel orientation or for the anti-parallel orientation;
    wherein mapping comprises:
        allocating the cells assessed to have a propensity for the parallel orientation of magnetization to a first group;
        allocating the cells assessed to have a propensity for the anti-parallel orientation of magnetization to a second group;

storing the location of each cell in the first group; and
storing the location of each cell in the second group; and wherein compensating comprises:
   writing data into the device such that a cell in the first group maybe used exclusively for storing data corresponding to the parallel state of magnetization; and
   writing data into the device such that a cell in the second group may be used exclusively for storing data corresponding to the anti-parallel state of magnetization.

8. A method for minimizing errors in a magnetoresistive solid-state storage device having a plurality of cells, the method comprising:
   identifying cells in the device which have a failure mode characterized by a propensity to remain in a particular orientation of magnetization;
   mapping the location of the identified cells;
   compensating for the failure mode of a cell at a mapped location; and
   determining whether the propensity of each identified cell is for the parallel orientation or for the anti-parallel orientation;

wherein mapping comprises:
      allocating the cells assessed to have a propensity for the parallel orientation of magnetization to a first group;
      allocating the cells assessed to have a propensity for the anti-parallel orientation of magnetization to a second group;
      storing the location of each cell in the first group; and
      storing the location of each cell in the second group; and wherein compensating comprises:
      determining a location of a first cell in the first group;
      determining a location of a second cell in the second group;
      writing data corresponding to the anti-parallel state of magnetization to the first cell;
      writing data corresponding to the parallel state of magnetization to the second cell; and
      marking the location of the first cell and the location of the second cell as containing inverted data.

9. The method of claim 1, wherein the magnetoresistive solid-state storage device is a magnetic random access memory device.

10. A system for minimizing errors in a magnetoresistive solid-state storage device having a plurality of cells, comprising:
   a memory element; and
   a processing element configured to identity cells in the device which have a failure mode characterized by a propensity to remain in a particular orientation of magnetization, to map the location of the identified cells, and to compensate for the failure mode of a mapped cell;
   wherein the processing element is further configured to identify the cells in a subset of the cells in the device which have a failure mode characterized by a propensity to remain in a particular orientation of magnetization, and to predict a failure mode of cells in the device outside of the subset based on the failure mode of the cells in the subset.

11. The system of claim 10 wherein the memory element and the processing element are fabricated as an application specific integrated circuit.

12. The system of claim 11, wherein the processing element is further configured to determine, for each of the identified cells, whether the cell has a propensity for the parallel orientation or for the anti-parallel orientation.

13. The system of claim 11, wherein the processing element is further configured to apply a magnetic field to cells in the device, and to identify the cells in the device for which the BH curve is offset by analyzing the BH curve for each of the cells in the device to which the magnetic field is applied.

14. The system of claim 11, wherein the memory element is a non-volatile memory element.

15. The system of claim 11, wherein the magnetoresistive solid-state storage device is a magnetic random access memory device.

16. The system of claim 11, wherein the processing element is further configured to apply a magnetic field to cells in the subset, to analyze the BH curve for each cell in the subset to which the magnetic field is applied, and to predict the failure mode of cells in the device outside the subset based on the cells in the subset for which the BH curve is offset.

17. The system of claim 12, wherein the processing element is further configured to allocate the cells having a propensity for the parallel orientation of magnetization to a first group and the cells having a propensity for the anti-parallel orientation of magnetization to a second group, and to map the location of each cell in the first group and the location of each cell in the second group into the memory element.

18. The system of claim 13, wherein the processing element is further configured to dynamically alter the strength of the magnetic field applied to write data to a cell having an offset of the BH curve.

19. The system of claim wherein the processing element is further configured to use the cells in the first group to store data corresponding to the parallel state of magnetization and to use cells in the second group to store data corresponding to the anti-parallel state of magnetization.

20. The system of claim 17, wherein the processing element is further configured to write data corresponding to the anti-parallel state of magnetization to a first cell in the first group, to write data corresponding to the parallel state of magnetization a second cell in the second group, and to mark the location of the first cell and the location of the second cell as containing inverted data.

21. A computer readable medium for facilitating the minimization of errors in a magnetoresistive solid-state storage device having a plurality of cells, comprising:
   identifying logic configured to identify cells in the device which have a failure mode characterized by a propensity to remain in a particular orientation of magnetization;
   mapping logic configured to man the location of the cells identified as having a failure mode characterized by a propensity to remain in a particular orientation of magnetization and
   compensation logic configured to compensate for the failure mode of a mapped cell;
   wherein the identifying logic is further configured to identify cells in a subset of the cells in the device which have a failure mode characterized by a propensity to remain in a particular orientation of magnetization, and to predict a failure mode of cells in the device outside the subset based on the failure mode of the identified cells in the subset.

22. The computer readable medium of claim 21, further comprising determining logic configured to determine whether the propensity of each identified cell is for the parallel orientation or for the anti-parallel orientation.

23. The computer readable medium of claim 21, wherein the identifying logic is further configured to apply a magnetic field to cells in the device and to identify cells in the device for which the BH curve is offset by analyzing the BH curve for each of the cells in the device to which the magnetic field is applied.

24. The computer readable medium of claim 21, wherein the magnetoresistive solid-state storage device is a magnetic random access memory device.

* * * * *